United States Patent
Chae

(10) Patent No.: US 11,614,768 B2
(45) Date of Patent: Mar. 28, 2023

(54) STORAGE DEVICE AND OPERATING METHOD THEREOF

(71) Applicant: SK hynix Inc., Gyeonggi-do (KR)

(72) Inventor: Kyeong Min Chae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 86 days.

(21) Appl. No.: 17/365,252

(22) Filed: Jul. 1, 2021

(65) Prior Publication Data

US 2022/0253090 A1    Aug. 11, 2022

(30) Foreign Application Priority Data

Feb. 5, 2021   (KR) ......................... 10-2021-0017016

(51) Int. Cl.
*G06F 1/08*   (2006.01)
*G06F 1/24*   (2006.01)

(52) U.S. Cl.
CPC . *G06F 1/08* (2013.01); *G06F 1/24* (2013.01)

(58) Field of Classification Search
CPC ..................................... G06F 1/08; G06F 1/24
See application file for complete search history.

(56) References Cited

U.S. PATENT DOCUMENTS

| | | | |
|---|---|---|---|
| 7,518,419 B1 * | 4/2009 | Pasqualini | H03K 17/223 327/143 |
| 8,907,688 B2 * | 12/2014 | Yoda | H03L 3/00 455/208 |
| 2005/0270852 A1 * | 12/2005 | Dietrich | G11C 11/4072 365/189.011 |

FOREIGN PATENT DOCUMENTS

JP    2002-330062 A    11/2002
KR    10-0579053 B1    5/2006

* cited by examiner

*Primary Examiner* — Zahid Choudhury
(74) *Attorney, Agent, or Firm* — IP & T Group LLP

(57) ABSTRACT

A memory device including a clock generator generating a data processing clock signal based on an external clock signal, and an input/output circuit performing a data transmission/reception operation of transmitting/receiving data to/from an external device based on the data processing clock signal, wherein the clock generator comprises a warm-up operation controller generating a warm-up enable signal for recognizing a portion of a period of the external clock signal as a dummy signal, and resetting the warm-up enable signal when a pause period where a toggle of the external clock signal is temporarily stopped is detected.

20 Claims, 13 Drawing Sheets

STORAGE DEVICE AND OPERATING METHOD THEREOF

CROSS-REFERENCE TO RELATED APPLICATION

The present application claims priority under 35 U.S.C. § 119(a) to Korean patent application number 10-2021-0017016 filed on Feb. 5, 2021, in the Korean Intellectual Property Office, the entire disclosure of which is incorporated by reference herein.

BACKGROUND

Field of Invention

Various embodiments relate generally to an electronic device, and more particularly, to a storage device and a method of operating the storage device.

Description of Related Art

A storage device is configured to store data in response to control of a host device such as a computer or a smartphone. A storage device may include a memory device storing data and a memory controller controlling the memory device. Memory devices may be divided into volatile memory devices and non-volatile memory devices.

A volatile memory device may retain data as long as power is being supplied, and may lose the stored data in the absence of power supply. Types of volatile memory devices may include Static Random Access Memory (SRAM), Dynamic Random Access Memory (DRAM), and the like.

A non-volatile memory device may not lose data even in the absence of power supply. Types of the non-volatile memory device may include Read Only Memory (ROM), Programmable ROM (PROM), Electrically Programmable ROM (EPROM), Electrically Erasable and Programmable ROM (EEPROM) and flash memory.

SUMMARY

Various embodiments of the present disclosure are directed to a memory device capable of implementing an improved warm-up cycle operation in a data transmission/reception operation.

According to one embodiment, a memory device may include a clock generator generating a data processing clock signal based on an external clock signal, and an input/output circuit performing a data transmission/reception operation of transmitting/receiving data to/from an external device based on the data processing clock signal, wherein the clock generator comprises a warm-up operation controller generating a warm-up enable signal for recognizing a portion of a period of the external clock signal as a dummy signal, and resetting the warm-up enable signal when a pause period where a toggle of the external clock signal is temporarily stopped is detected.

According to one embodiment, a method of operating a memory device transmitting/receiving data to/from an external device may include receiving an external clock signal, generating a warm-up enable signal to recognize a portion of a period of the external clock signal as a dummy signal, generating a data processing clock signal based on the warm-up enable signal and the external clock signal, detecting a pause period where a toggle of the external clock signal is temporarily stopped, and resetting the warm-up enable signal when the pause period is detected.

According to one embodiment, a semiconductor apparatus may include an operation control circuit configured to perform an operation according to a first clock signal, and a clock generating circuit configured to enable, in response to activation of a second clock signal, a warm-up enable signal at a predetermined amount of time after the activation to activate the first clock signal, the second clock signal having a leading deactivated time section and the first clock signal having a lagging deactivated time section, and disable the warm-up enable signal when detecting the lagging deactivated time section.

DETAILED DESCRIPTION

Figure 1:
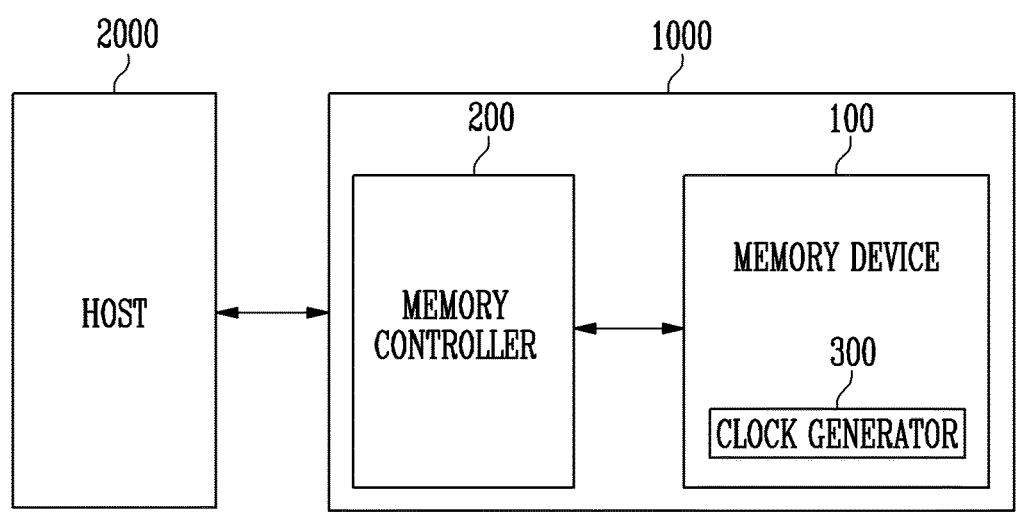
FIG. 1 is a block diagram illustrating a storage device according to an embodiment of the present disclosure.

Structural or functional descriptions of embodiments in accordance with concepts which are disclosed in this specification are illustrated to describe the embodiments in accordance with how the concepts of and the various embodiments may be carried out. The descriptions below do not limit the invention.

Various modifications and changes may be applied to the embodiments in accordance with the concepts and the embodiments illustrated in the drawings and described in the specification. However, the various embodiments of the present disclosure are not limited to the disclosures herein, and include all changes, equivalents, or substitutes that do not depart from the scope of the present disclosure. In describing those embodiments, descriptions are omitted for techniques that are well known to the art and to which the present disclosure pertains, and are omitted for techniques that are not directly related to the present disclosure.

Hereinafter, various embodiments of the present disclosure will be described in detail with reference to the accompanying drawings.

FIG. 1 is a block diagram illustrating a storage device 1000 according to an embodiment of the present disclosure.

Referring to FIG. 1, the storage device 1000 may include a memory device 100 and a memory controller 200.

The storage device 1000 may be configured to store data in response to control of a host 2000. Examples of the storage device 1000 may include a cellular phone, a smartphone, an MP3 player, a laptop computer, a desktop computer, a game player, a display device, a tablet PC, and an in-vehicle infotainment system.

The storage device 1000 may be manufactured as one of various types of storage devices according to a host interface corresponding to a communication method with the host 2000. For example, the storage device 1000 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and a memory stick.

The storage device 1000 may be manufactured as any one of various types of packages. For example, the storage device 1000 may be manufactured in any one of various kinds of package types, such as a package-on-package (POP), a system-in-package (SIP), a system-on-chip (SOC), a multi-chip package (MCP), a chip-on-board (COB), a wafer-level fabricated package (WFP), and a wafer-level stack package (WSP).

The memory device 100 may store data or utilize stored data. More specifically, the memory device 100 may operate in response to control of the memory controller 200. In addition, the memory device 100 may include a plurality of memory dies including a memory cell array having a plurality of memory cells storing data.

The memory cells may be a single level cell (SLC) that stores 1 bit of data, a multi-level cell (MLC) that stores 2 bits of data, a triple-level cell (TLC) that stores 3 bits of data, and a quadruple level cell (QLC) that stores 4 bits of data.

The memory cell array may include a plurality of memory blocks. Each memory blocks may include a plurality of memory cells. The memory blocks may include a plurality of pages. A page may be a unit for storing data in the memory device 100, or a unit for reading data stored in the memory device 100.

Examples of the memory device 100 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), NAND flash memory, vertical NAND flash memory, NOR flash memory, resistive random access memory (RRAM), phase-change random access memory (PRAM), magnetoresistive random access memory (MRAM), ferroelectric random access memory (FRAM), and spin transfer torque random access memory (STT-RAM). For convenience of explanation, it is assumed that the memory device 100 is a NAND flash memory.

The memory device 100 may receive a command and an address from the memory controller 200. The memory device 100 may be configured to access an area selected in response to the received address in the memory cell array. When the memory device 100 accesses the selected area, the memory device 100 may perform an operation on the selected area corresponding to the received command. For example, the memory device 100 may perform write (program), read and erase operations. A program operation may refer to an operation by which the memory device 100 writes data into the area selected by the address. A read operation may refer to an operation by which the memory device 100 reads data from the area selected by the address. An erase operation may refer to an operation during which the memory device 100 erases the data stored in the area selected by the address.

According to one embodiment, the memory device 100 may include a clock generator 300. The clock generator 300 may receive an external clock signal from an external device, for example, the memory controller 200 or the host 2000, and may generate an internal clock by using the received external clock signal. The clock generator 300 may generate, based on the internal clock, a data processing clock signal, which is used by the memory device 100 when data is transmitted/received to/from the external device. The memory device 100 may perform a data transmission/reception operation to transmit/receive data to/from the external device on the basis of the data processing clock signal.

The memory controller 200 may control the general operations of the storage device 1000. More specifically, the memory controller 200 may execute firmware FW when power is applied to the storage device 1000. The firmware FW may include a host interface layer (HIL) that receives a request input from the host 2000 or outputs a response to the host 2000, a flash translation layer (FTL) that manages operations between an interface of the host 2000 and an interface of the memory device 100, and a flash interface layer (FIL) that provides a command to the memory device 100 or receives a response from the memory device 100.

The memory controller 200 may receive data and a logical address LA from the host 2000 and convert the logical address LA into a physical address PA indicating an address of memory cells where the data in the memory device 100 is stored. The logical address LA may be a logical block address LBA and the physical address PA may be a physical block address PBA.

The memory controller 200 may control the memory device 100 to perform program, read or erase operations at the request of the host 2000. During a program operation, the memory controller 200 may provide a program command, a physical block address, and data to the memory device 100. During a read operation, the memory controller 200 may provide a read command and a physical block address to the memory device 100. During an erase operation, the memory controller 200 may provide an erase command and a physical block address to the memory device 100.

According to one embodiment of the present disclosure, the memory controller 200 may control the memory device 100 to perform a read operation in response to a read request from the host 2000. In addition, when the read operation fails, the memory controller 200 may control the memory device 100 to perform a read retry operation to retry a read operation by changing a voltage level of a read voltage.

The memory controller 200 may control the memory device 100 to perform program, read or erase operations at the request of the host 2000 regardless of a request from the host 2000. For example, the memory controller 200 may control the memory device 100 to perform the program, read, or erase operations during background operations such as for example wear leveling, garbage collection and read reclaim.

The host 2000 may communicate with the storage device 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
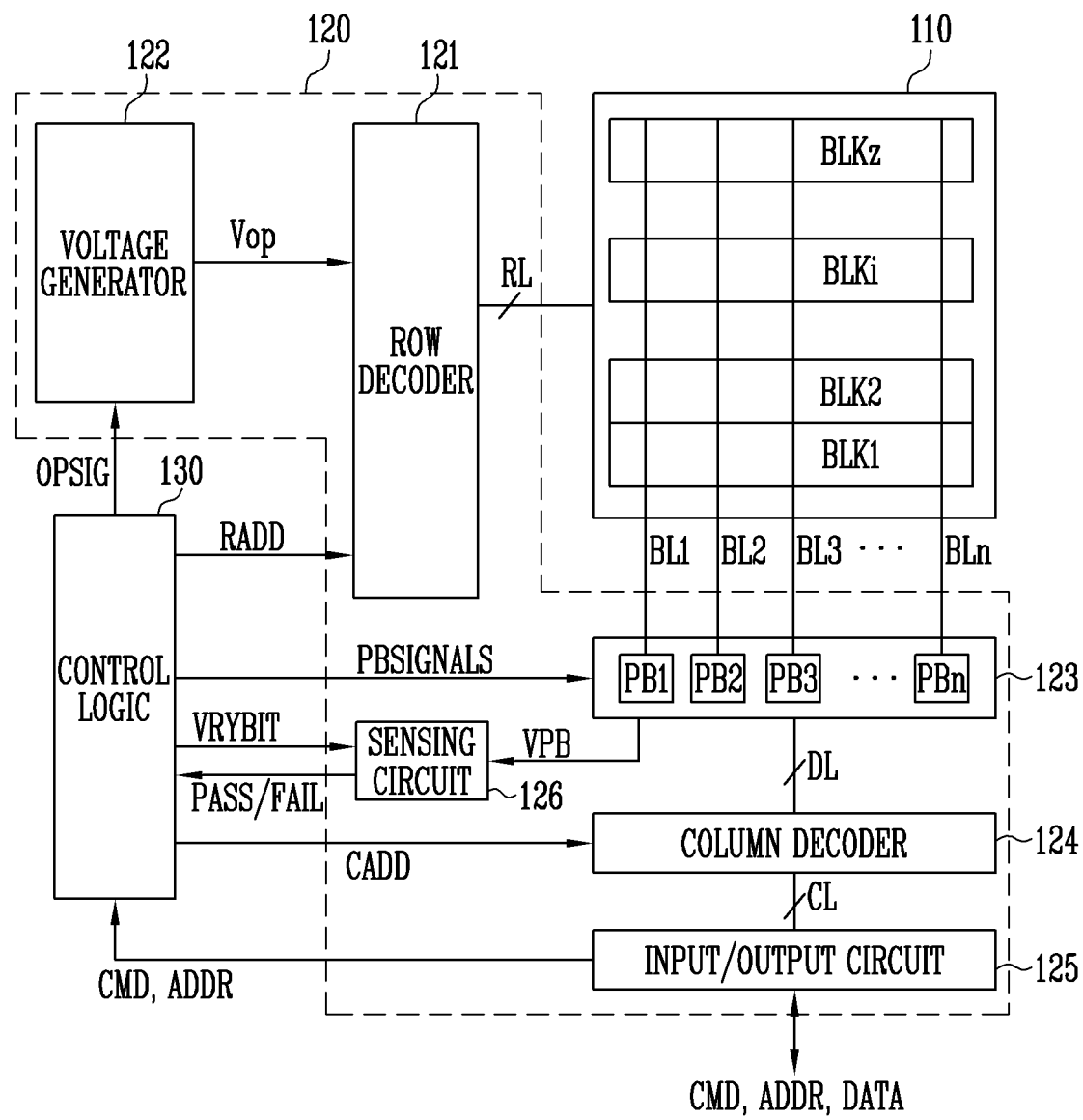
FIG. 2 is a block diagram illustrating a memory device according to an embodiment of the present disclosure.

FIG. 2 is a block diagram illustrating the memory device 100 according to one embodiment of the present disclosure.

Referring to FIG. 2, the memory device 100 may include a memory cell array 110, a peripheral circuit 120, and a control logic 130.

The memory cell array 110 shown in FIG. 2 includes a plurality of memory blocks BLK1 to BLKz. The plurality of memory blocks BLK1 to BLKz may be coupled to a row decoder 121 through row lines RL. The row lines RL may include at least one source select line, a plurality of word lines and at least one drain select line. The plurality of memory blocks BLK1 to BLKz may be coupled to a page buffer group 123 through bit lines BL1 to BLn. Each of the plurality of memory blocks BLK1 to BLKz may include a plurality of memory cells. According to one embodiment, the plurality of memory cells may be non-volatile memory cells. Memory cells coupled to the same word line may be defined as one page. Therefore, each memory blocks may include a plurality of pages.

The memory cells included in the memory cell array 110 may include a single-level cell (SLC) storing a single data bit, a multi-level cell (MLC) storing two data bits, a triple-level cell (TLC) storing three data bits, or a quad-level cell (QLC) storing four data bits.

The peripheral circuit 120 may be configured to perform program, read, or erase operations on a selected area of the memory cell array 110 in response to control of the control logic 130. In other words, the peripheral circuit 120 may drive the memory cell array 110 in response to the control logic 130. For example, the peripheral circuit 120 may apply various operating voltages to the row lines RL and the bit lines BL1 to BLn or discharge the applied voltages in response to control of the control logic 130.

More specifically, the peripheral circuit 120 may include the row decoder 121, a voltage generator 122, the page buffer group 123, a column decoder 124, an input/output circuit 125, and a sensing circuit 126.

The row decoder 121 may be coupled to the memory cell array 110 through the row lines RL. The row lines RL may include at least one source select line, a plurality of word lines, and at least one drain select line. According to one embodiment, the word lines may include normal word lines and dummy word lines. In addition, the row lines RL may further include a pipe select line.

The row decoder 121 may be configured to operate in response to control of the control logic 130. The row decoder 121 may receive a row address RADD from the control logic 130. More specifically, the row decoder 121 may be configured to decode the row address RADD. The row decoder 121 may select at least one memory block among the memory blocks BLK1 to BLKz according to the decoded address. The row decoder 121 may select at least one word line WL of the selected memory block so as to apply voltages generated by the voltage generator 122 to at least one word line WL according to the decoded address.

In one embodiment, during a program operation, the row decoder 121 may apply a program voltage to the selected word line and a program pass voltage having a lower voltage level than the program voltage to the unselected word lines. During a program verify operation, the row decoder 121 may apply a verify voltage to the selected word line and a verify pass voltage greater than the verify voltage to the unselected word lines. During a read operation, the row decoder 121 may apply a read voltage to the selected word line and a read pass voltage greater than the read voltage to the unselected word lines.

According to one embodiment, an erase operation of the memory cell array 110 may be performed in at least one unit of memory blocks. During an erase operation, the row decoder 121 may select one of the memory blocks according to the decoded address, and the row decoder 121 may apply a ground voltage to word lines coupled to the selected memory block.

The voltage generator 122 may operate in response to control of the control logic 130. More specifically, the voltage generator 122 may be configured to generate a plurality of voltages by using an external power voltage supplied to the memory device 100 in response to the control logic 130. For example, the voltage generator 122 may generate a program voltage, a verify voltage, a pass voltage, a read voltage, and an erase voltage in response to the control of the control logic 130. In other words, the voltage generator 122 may generate various operating voltages Vop for program, read and erase operations in response to an operation signal OPSIG.

According to one embodiment, the voltage generator 122 may generate an internal power voltage by regulating the external power voltage. The internal power voltage generated by the voltage generator 122 may serve as an operating voltage of the memory cell array 110.

According to one embodiment, the voltage generator 122 may generate a plurality of voltages by using the external power voltage or the internal power voltage. For example, the voltage generator 122 may include a plurality of pumping capacitors receiving the internal power voltage and generate a plurality of voltages by selectively activating the plurality of pumping capacitors in response to the control of the control logic 130. The plurality of generated voltages may be supplied to the memory cell array 110 by the row decoder 121.

The page buffer group 123 may include first to nth page buffers PB1 to PBn. The first to nth page buffers PB1 to PBn may be coupled to the memory cell array 110 through the first to nth bit lines BL1 to BLn, respectively. The first to nth page buffers PB1 to PBn may operate in response to the control of the control logic 130. More specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or may sense voltages or currents in the first to nth bit lines BL1 to BLn during a read or verify operation.

During a program operation, the first to nth page buffers PB1 to PBn may transfer data DATA received through the input/output circuit 125 to selected memory cells through the first to nth bit lines BL1 to BLn when a program pulse is applied to a selected word line during a program operation. Memory cells of the selected page may be programmed according to the transferred data DATA. A memory cell coupled to a bit line to which a program permission voltage (e.g., a ground voltage) is applied may have an increased threshold voltage. A threshold voltage of a memory cell coupled to a bit line to which a program inhibition voltage (for example, a power voltage) is applied may be maintained.

During a program verify operation, the first to nth page buffers PB1 to PBn may read page data from the selected memory cells through the first to nth bit lines BL1 to BLn, respectively.

During a read operation, the first to nth page buffers PB1 to PBn may read the data DATA from the memory cells of the selected page through the first to nth bit lines BL1 to BLn and may output the read data DATA to the data input/output circuit 125 in response to control of the column decoder 124.

During an erase operation, the first to nth page buffers PB1 to PBn may float the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL, or may exchange data with the input/output circuit 125 through column lines CL.

The input/output circuit 125 may transfer a command CMD and an address ADDR from the memory controller 200 to the control logic 130, or may exchange the data DATA with the column decoder 124.

The sensing circuit 126 may generate a reference current in response to an allowable bit signal VRYBIT and compare a sensing voltage VPB received from the page buffer group 123 with a reference voltage generated by the reference current to output a pass signal PASS or a fail signal FAIL during a read operation or a verify operation.

The control logic 130 may control the peripheral circuit 120 by outputting the operation signal OPSIG, the row address RADD, the page buffer control signals PBSIGNALS and the allowable bit signal VRYBIT in response to the command CMD and the address ADDR.

In addition, the control logic 130 may determine whether a verify operation passes or fails in response to the pass or fail signal PASS or FAIL. In addition, the control logic 130 may control the page buffer group 123 to temporarily store verify operation including the pass or fail signal PASS or FAIL in the page buffer group 123. More specifically, the control logic 130 may determine a program state of a memory cell in response to the pass signal PASS or the fail signal FAIL. For example, when the memory cell operates as a triple level cell (TLC), the control logic 130 may determine whether the program state of the memory cell is an erase state E or one of the first to seventh program states P1 to P7.

Figure 3:
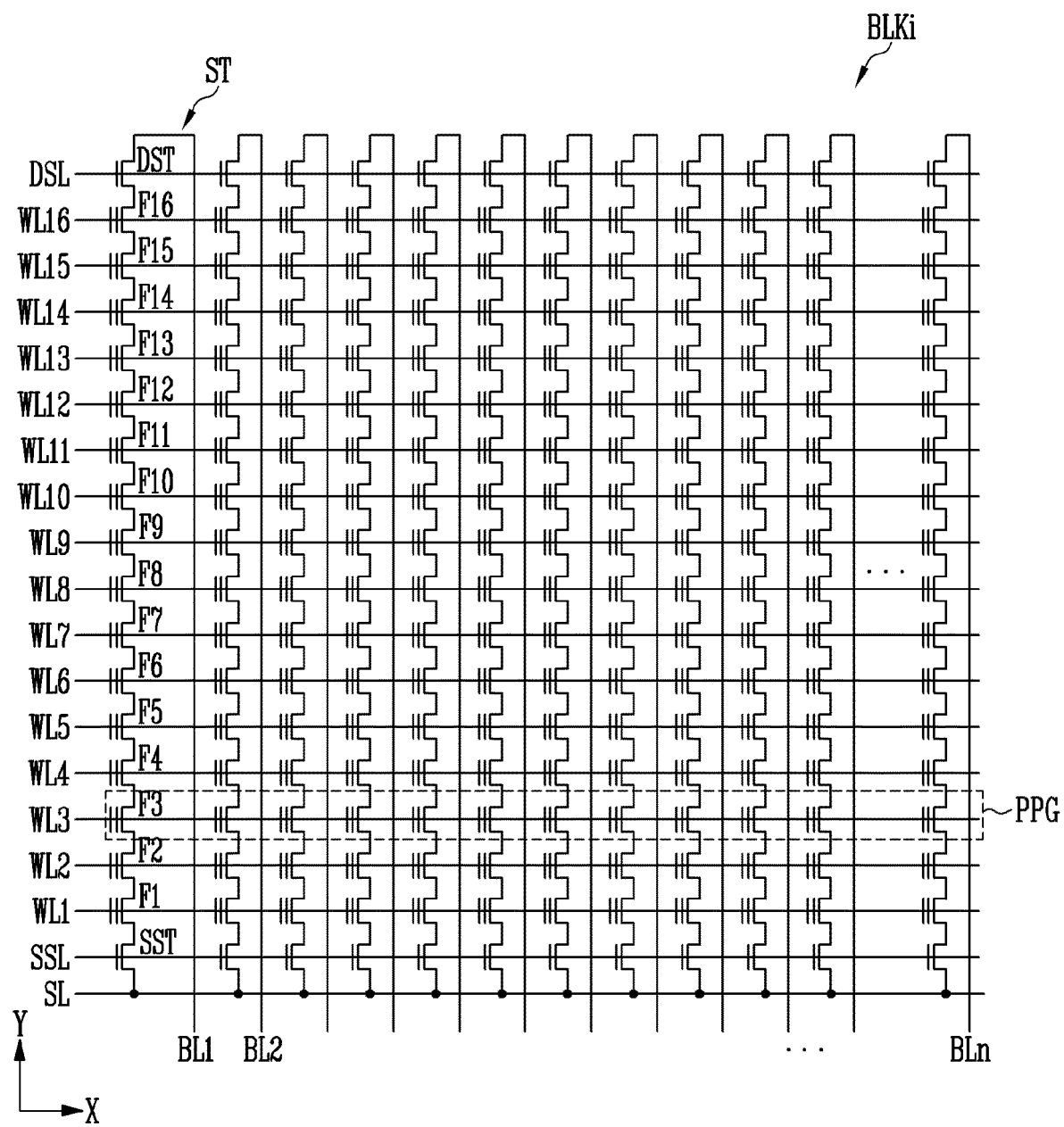
FIG. 3 is a block diagram illustrating a memory block according to an embodiment of the present disclosure.

FIG. 3 is a block diagram illustrating a memory block BLKi according to an embodiment of the present disclosure.

Referring to FIG. 3, the memory block BLKi may be coupled to a plurality of word lines that are arranged in parallel between a first select line and a second select line. The first select line may be a source select line SSL and the second select line may be a drain select line DSL. Specifically, the memory block BLKi may include a plurality of strings ST that are coupled between the bit lines BL1 to BLn and a source line SL. The bit lines BL1 to BLn may be coupled to the strings ST, respectively, and the source line SL may be coupled in common to the strings ST. Since the strings ST may have the same configuration, the string ST which is coupled to the first bit line BL1 will be described in detail by way of example.

The string ST may include a source select transistor SST, a plurality of memory cells F1 to F16, and a drain select transistor DST coupled in series between the source line SL and the first bit line BL1. Each string ST may include at least one source select transistor SST, at least one drain select transistor DST, and more memory cells necessarily than the number of memory cells F1 to F16 shown in FIG. 3.

A source of the source select transistor SST may be coupled to the source line SL and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to a plurality of word lines WL1 to WL16. A group of memory cells coupled to the same word line, among memory cells included in different strings ST, may be referred to as a physical page PPG. Therefore, the memory block BLKi may include as many physical pages PPGs as the number of word lines WL1 to WL16.

The memory cells may be a single level cell (SLC) that stores 1 bit of data, a multi-level cell (MLC) that stores 2 bits of data, a triple-level cell (TLC) that stores 3 bits of data, and a quadruple level cell (QLC) that stores 4 bits of data.

The single level cell (SCL) may include one-bit data. One physical page PPG of the single level cell may store one logical page (LPG) data. One LPG data may include as many data bits as the number of cells included in one physical page PPG.

The multi-level cell (MLC), the triple level cell (TLC), and the quad level cell (QLC) may store two or more bits of data. One physical page PPG may store data corresponding to two or more logical pages LPG.

Figure 4:
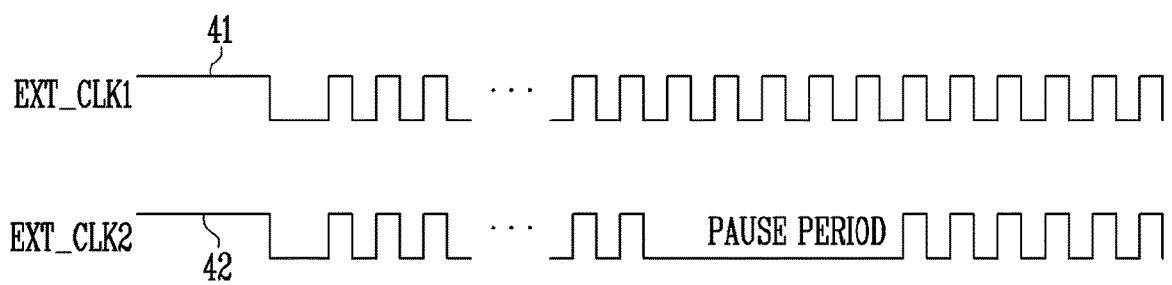
FIG. 4 is a diagram illustrating a pattern of an external clock signal according to an embodiment of the present disclosure.

FIG. 4 is a diagram illustrating a pattern of an external clock signal according to one embodiment of the present disclosure.

FIG. 4 shows a first external clock signal 41 and a second external clock signal 42. The memory device 100 may generate a data processing clock signal based on an external clock signal which is input from an external device. The external clock signal may be input in the form of a digital signal which repeatedly toggles between 0 and 1 and which includes a pause period where the toggle is temporarily stopped.

For example, the first external clock signal 41 may be input in the form of a digital signal which repeatedly toggles between 0 and 1. In addition, the second external clock signal 42 may be input in the form of a digital signal which repeatedly toggles and which includes a pause period where the toggle is temporarily stopped.

Figure 5:
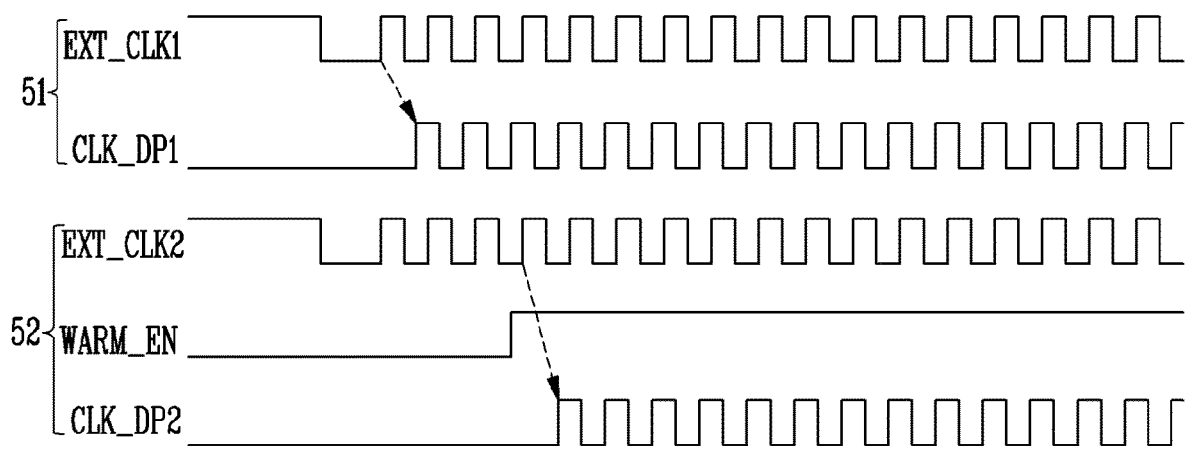
FIG. 5 is a diagram for illustrating a warm-up cycle operation according to an embodiment of the present disclosure.

FIG. 5 is a diagram for illustrating a warm-up cycle operation according to one embodiment of the present disclosure.

Referring to FIG. 5, a first signal set 51 may include a first data processing clock signal CLK_DP1, and a second signal set 52 may include a second data processing clock signal CLK_DP2. As shown in FIG. 5, the first data processing clock signal CLK_DP1 included in the first signal set 51 may be generated based on an external clock signal EXT_CLK1. In the first signal set 51, after the external clock signal EXT_CLK1 is input, the first data processing clock signal CLK_DP1 may be generated with no intentional delay. In other words, the first signal set 51 may correspond to a general clock operation that does not include a warm-up cycle operation.

On the other hand, the second data processing clock signal CLK_DP2 included in the second signal set 52 may be generated in response to a warm-up enable signal WARM_EN. More specifically, in the second signal set 52, an external clock signal EXT_CLK2 may be recognized as a dummy signal until the warm-up enable signal WARM_EN is applied, and the second data processing clock signal CLK_DP2 may be generated based on the external clock signal EXT_CLK2 after the warm-up enable signal WARM_EN is applied.

As a data exchange rate between the memory device 100 and an external device is increased, a signal integrity issue has been arisen. When a clock is toggled at a high rate, a signal integrity issue may become a concern particularly in an early stage due to a channel effect. The memory device 100 may recognize toggles of the clock during an initial section as dummy to avoid the signal integrity issue. In other words, a warm-up cycle operation may control the memory device 100 so that a part of a period of the external clock signal may be disregarded. In addition, the memory device 100 may prevent a signal integrity issue, which is caused by the channel effect at early stage when the external clock is toggled, by a warm-up cycle operation.

Figure 6:
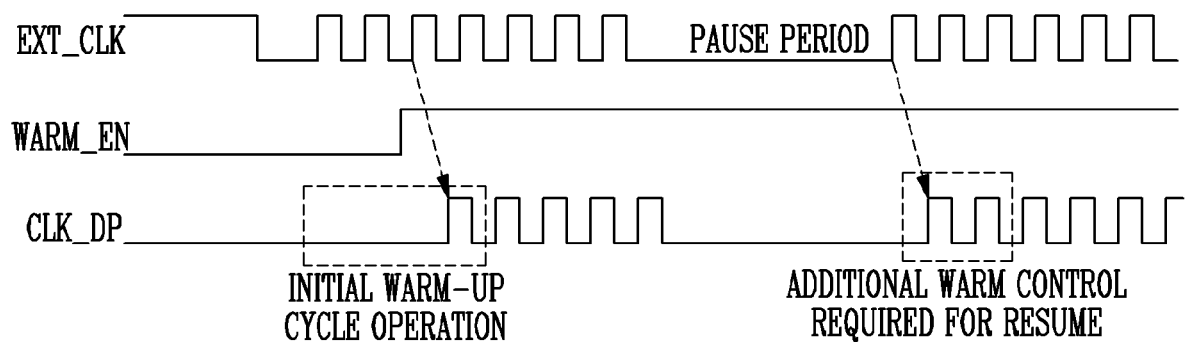
FIG. 6 is a diagram illustrating a conventional warm-up cycle operation after a pause period.

FIG. 6 is a diagram illustrating a conventional warm-up cycle operation after a pause period.

FIG. 6 illustrates a data processing clock signal CLK_DP which is generated according to a conventional method when an external clock signal EXT_CLK is resumed after a pause period. More specifically, when the external clock signal EXT_CLK is input to a conventional memory device, the conventional memory device may recognize the external clock signal EXT_CLK, which is input before the warm-up enable signal WARM_EN is input, as a dummy signal. However, according to the conventional method, after the pause period in which a toggle operation of the external clock signal EXT_CLK is temporarily stopped, there may be no signal and configuration for resetting the warm-up enable signal WARM_EN. Therefore, since the warm-up enable signal WARM_EN stays enabled after a warm-up cycle operation is performed, a signal integrity issue may arise.

Figure 7:
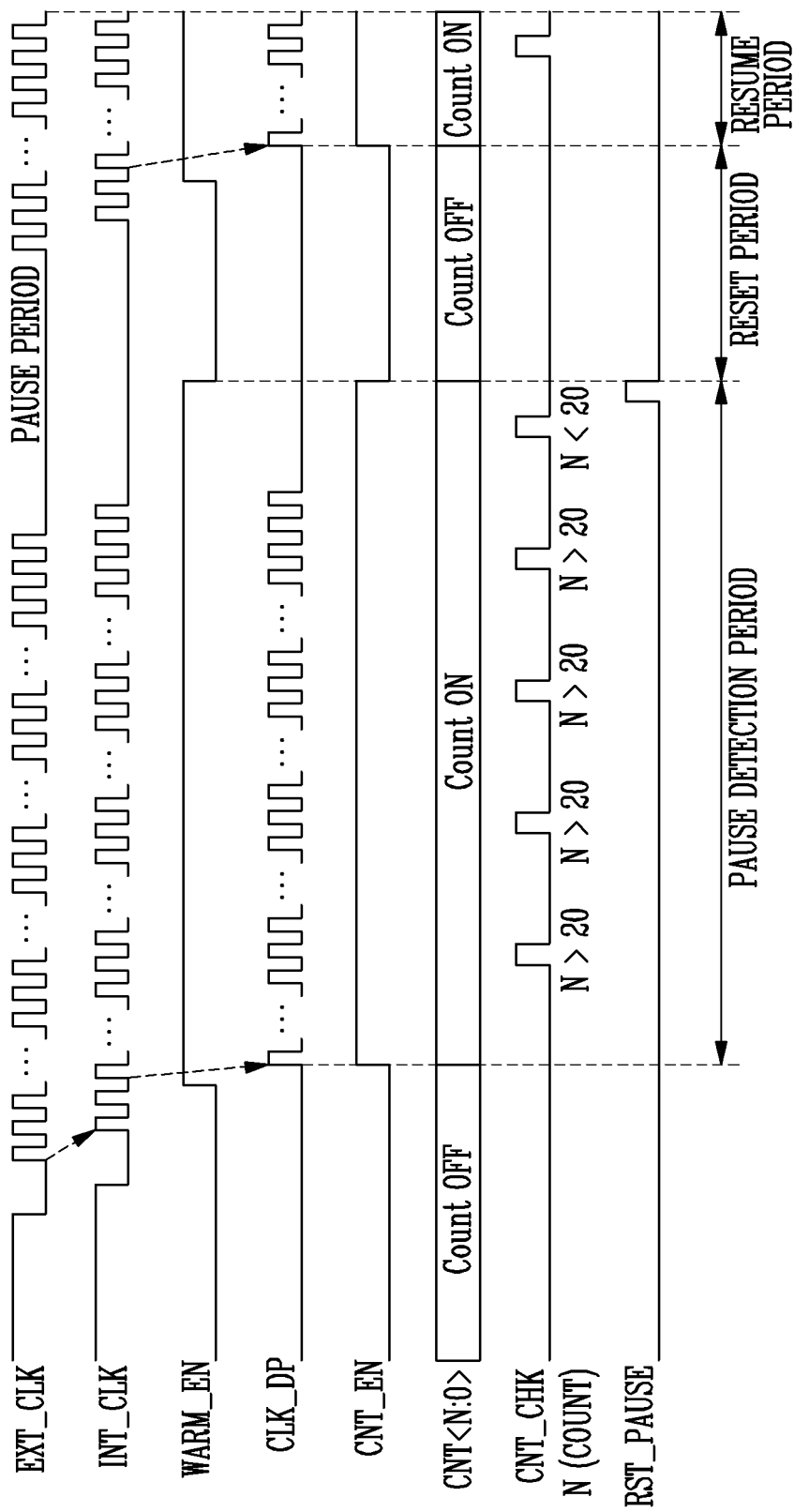
FIG. 7 is a timing diagram illustrating a warm-up cycle operation including a pause period according to an embodiment of the present disclosure.

FIG. 7 is a timing diagram illustrating a warm-up cycle operation including a pause period according to one embodiment of the present disclosure.

Referring to FIG. 7, timing diagrams of the external clock signal EXT_CLK, an internal clock signal INT_CLK, the warm-up enable signal WARM_EN, the data processing clock signal CLK_DP, a count enable signal CNT_EN, a count check signal CNT_CHK and a warm-up reset signal RST_PAUSE are shown.

First, when the memory device 100 receives the external clock signal EXT_CLK from an external clock, the memory device 100 may provide the internal clock signal INT_CLK on the basis of the external clock signal EXT_CLK into the memory device 100. In addition, the memory device 100 may generate the warm-up enable signal WARM_EN after a predetermined period of time.

In addition, the memory device 100 may generate the internal clock signal INT_CLK on the basis of the external clock signal EXT_CLK. As illustrated in FIG. 7, the internal clock signal INT_CLK may be a delayed version of the external clock signal EXT_CLK, and therefore the internal clock signal INT_CLK may have a pause period which lags behind the pause period of the external clock signal EXT_CLK. More specifically, the memory device 100 may generate the data processing clock signal CLK_DP according to the internal clock signal INT_CLK and the warm-up enable signal WARM_EN. As illustrated in FIG. 7, the data processing clock signal CLK_DP may be a delayed version of the internal clock signal INT_CLK, and therefore the data processing clock signal CLK_DP may have a pause period which lags behind the pause period of the external clock signal EXT_CLK. When the data processing clock signal CLK_DP is generated, the memory device 100 may generate the count enable signal CNT_EN. The memory device 100 may count a number of toggles of the data processing clock signal CLK_DP in response to the count enable signal CNT_EN. More specifically, the memory device 100 may detect edges of the data processing clock signal CLK_DP to count the number of toggles of the data processing clock signal CLK_DP. The memory device 100 may check a state of the data processing clock signal CLK_DP by comparing the number of toggles of the data processing clock signal CLK_DP, which are counted every predetermined period (e.g., a period of the count check signal CNT_CHK), with a predetermined number.

In addition, when the data processing clock signal CLK_DP is in a pause state, the memory device 100 may generate the warm-up reset signal RST_PAUSE and disable the count enable signal CNT_EN. More specifically, when the number of toggles of the data processing clock signal CLK_DP is greater than or equal to the predetermined number, the memory device 100 may keep the warm-up enable signal WARM_EN and the count enable signal CNT_EN enabled. On the other hand, when the number of toggles of the data processing clock signal CLK_DP is smaller than the predetermined number, the memory device 100 may generate the warm-up reset signal RST_PAUSE and disable the count enable signal CNT_EN. In other words, when the data processing clock signal CLK_DP is in a pause state in which the toggle of the data processing clock signal CLK_DP is temporarily stopped, the memory device 100 may reset, i.e., disable the warm-up enable signal WARM_EN and the count enable signal CNT_EN.

Thereafter, when the external clock signal EXT_CLK is detected, the memory device 100 may perform a warm-up cycle operation in the same manner.

Figure 8:
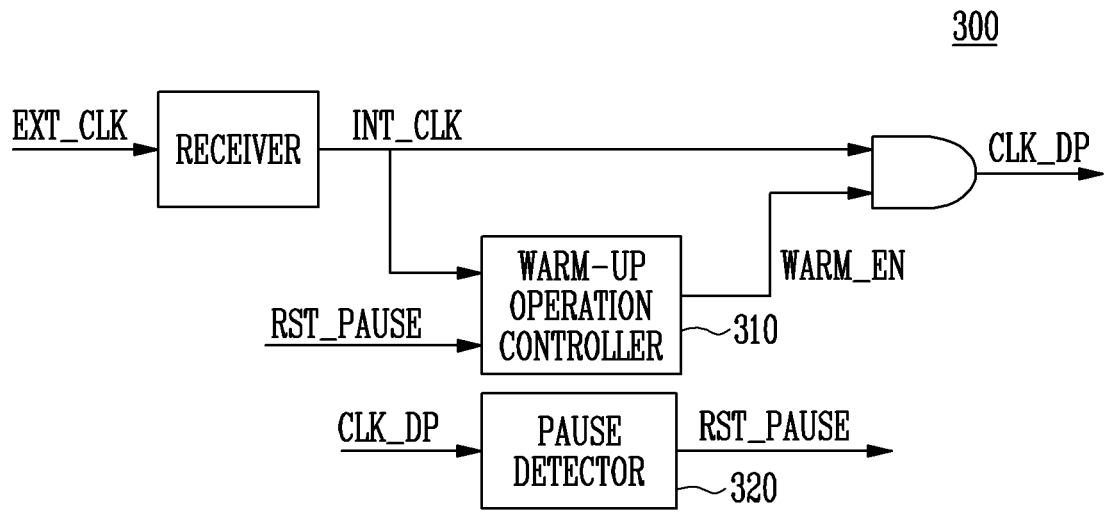
FIG. 8 is a block diagram illustrating a clock generator according to an embodiment of the present disclosure.

FIG. 8 is a block diagram illustrating the clock generator 300 according to one embodiment of the present disclosure.

Referring to FIG. 8, the clock generator 300 may include a warm-up operation controller 310 and a pause detector 320.

The clock generator 300 may generate the data processing clock signal CLK_DP on the basis of an external clock signal EXT_CLK which is input from an external clock. More specifically, the clock generator 300 may include a receiver RECEIVER. The receiver RECEIVER may receive the external clock signal EXT_CLK from the external clock. The receiver may transfer the internal clock signal INT_CLK (on the basis of the external clock signal EXT_CLK) to the warm-up operation controller 310 and to an AND operator.

The warm-up operation controller 310 may generate the warm-up enable signal WARM_EN when the internal clock signal INT_CLK is detected. More specifically, the warm-up operation controller 310 may generate the warm-up enable signal WARM_EN after a predetermined amount of time has passed after receiving the internal clock signal INT_CLK from the receiver. The generated warm-up enable signal WARM_EN may be provided to the AND operator. Based on the internal clock signal INT_CLK and the warm-up enable signal WARM_EN, the AND operator may output the data processing clock signal CLK_DP. That is, the AND operator may output the internal clock signal INT_CLK as the data processing clock signal CLK_DP when the warm-up enable signal WARM_EN is enabled.

The pause detector 320 may receive the data processing clock signal CLK_DP and determine whether a pause period exists where a toggle of the data processing clock signal CLK_DP is temporarily stopped, on the basis of the received data processing clock signal CLK_DP. In addition, when the pause detector 320 determines that the pause period exists, the pause detector 320 may transfer the warm-up reset signal RST_PAUSE to the warm-up operation controller 310.

The warm-up operation controller 310 may reset a warm-up cycle operation on the basis of the warm-up reset signal RST_PAUSE which is received from the pause detector 320. More specifically, when the warm-up operation controller 310 receives the warm-up reset signal RST_PAUSE from the pause detector 320, the warm-up operation controller 310 may disable the warm-up enable signal WARM_EN. The warm-up reset signal RST_PAUSE may control the warm-up operation controller 310 to reset, i.e., disable the warm-up enable signal WARM_EN. In addition, when the warm-up operation controller 310 detects the internal clock signal INT_CLK to resume toggling after its pause period under a situation that the warm-up enable signal WARM_EN stays disabled, the warm-up operation controller 310 may generate, i.e., enable the warm-up enable signal WARM_EN, and the warm-up cycle operation may be performed again. In other words, when the external clock signal EXT_CLK resumes its toggling after its pause period, the warm-up operation controller 310 may generate an enabled warm-up enable signal WARM_EN, and the clock generator 300 may resume the toggling of the data processing clock signal CLK_DP after its pause period. That is, the warm-up cycle operation may be performed on the resumed external clock signal EXT_CLK to resume the data processing clock signal CLK_DP after their pause periods. In other words, the clock generator 300 may recognize an initial section of the resumed external clock signal EXT_CLK as a dummy signal. Here, the initial section may be at least a sum of the amount of time that the receiver RECEIVER transfers the external clock signal EXT_CLK as the internal clock signal INT_CLK to the warm-up operation controller 310 and the predetermined amount of time that the warm-up operation controller 310 generates the warm-up enable signal WARM_EN in response to the internal clock signal INT_CLK.

Figure 9:
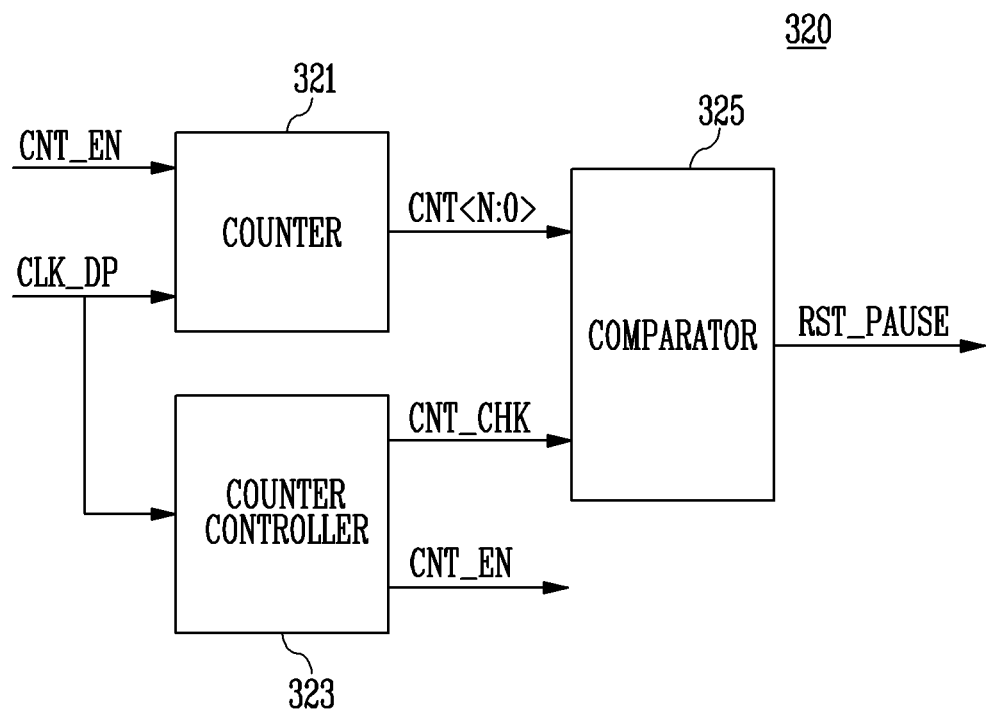
FIG. 9 is a block diagram illustrating a pause detector according to an embodiment of the present disclosure.

FIG. 9 is a block diagram illustrating the pause detector 320 according to one embodiment of the present disclosure.

Referring to FIG. 9, the pause detector 320 may include a counter 321, a counter controller 323 and a comparator 325.

When the count enable signal CNT_EN is input, the counter 321 may count a number of toggles of the data processing clock signal CLK_DP. In addition, the counter 321 may transfer a result CNT<N:0> representing the counted number of toggles of the data processing clock signal CLK_DP to the comparator 325.

When the data processing clock signal CLK_DP is detected, the counter controller 323 may generate the count enable signal CNT_EN so that the counter 321 may detect the toggles of the data processing clock signal CLK_DP. The counter controller 323 may transfer the generated count enable signal CNT_EN to the counter 321 and may control the counter 321 to count the toggles of the data processing clock signal CLK_DP. In addition, the counter controller 323 may generate the count check signal CNT_CHK which has a predetermined period. The count check signal CNT_CHK may be used to check a variation in the result CNT<N:0> representing the counted number of toggles of the data processing clock signal CLK_DP. In addition, the counter controller 323 may transfer the count check signal CNT_CHK to the comparator 325.

The comparator 325 may detect a pause period. More specifically, the comparator 325 may receive the result CNT<N:0> representing the counted number of toggles of the data processing clock signal CLK_DP from the counter 321. In addition, the comparator 325 may receive the count check signal CNT_CHK which has a predetermined period. The comparator 325 may compare the counting result CNT<N:0> with a predetermined number every predetermined period. In addition, the comparator 325 may detect a pause period using the counting result CNT<N:0>. More specifically, the comparator 325 may generate the warm-up reset signal RST_PAUSE when the counting result CNT<N:0> has a value less than the predetermined number. For example, when the predetermined number is twenty (20), the comparator 325 may compare the result CNT<N:0> representing the counted number of toggles of the data processing clock signal CLK_DP with the predetermined number, i.e., twenty, whenever the comparator 325 receives the count check signal CNT_CHK at each predetermined period. When the result CNT<N:0> representing the counted number of toggles of the data processing clock signal CLK_DP is greater than or equal to 20, the comparator 325 may determine that the data processing clock signal CLK_DP is toggling. On the other hand, the comparator 325 may determine that a pause period of the data processing clock signal CLK_DP exists when the result CNT<N:0> representing the counted number of toggles of the data processing clock signal CLK_DP is less than 20. When the pause period of the data processing clock signal CLK_DP exists, the comparator 325 may generate the warm-up reset signal RST_PAUSE.

Figure 10:
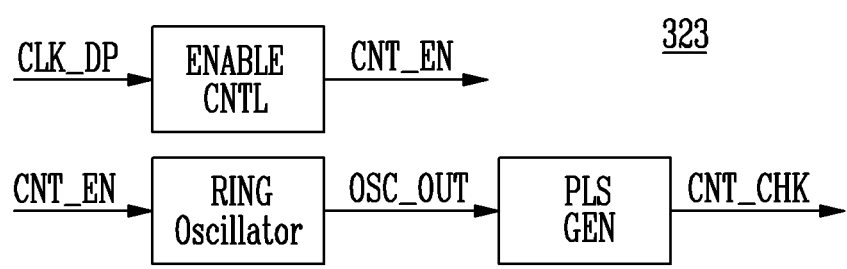
FIG. 10 is a block diagram illustrating a counter controller according to an embodiment of the present disclosure.

FIG. 10 is a block diagram illustrating the counter controller 323 according to one embodiment of the present disclosure.

Referring to FIG. 10, the counter controller 323 may generate the count enable signal CNT_EN and the count check signal CNT_CHK. More specifically, when the data processing clock signal CLK_DP is detected, the counter controller 323 may generate the count enable signal CNT_EN using an enable controller ENABLE CNTL. In addition, the counter controller 323 may determine a period of the count check signal CNT_CHK using a ring oscillator 324. The counter controller 323 may generate the count check signal CNT_CHK using a signal generator PLS GEN. The count check signal CNT_CHK may be used to check a variation in the result (CNT<N:0>) of counting the data processing clock signal CLK_DP.

Figure 11:
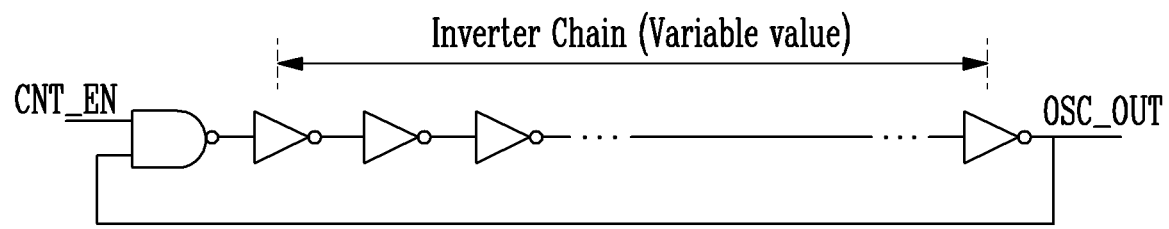
FIG. 11 is a diagram illustrating a ring oscillator according to an embodiment of the present disclosure.

FIG. 11 is a diagram illustrating a ring oscillator according to one embodiment of the present disclosure.

Referring to FIG. 11, the ring oscillator 324 may include a plurality of inverters. The plurality of inverters may form a chain. The number of inverters may be set according to a required period of the count check signal CNT_CHK. When the count enable signal CNT_EN is input to the ring oscillator 324, the ring oscillator 324 may generate an oscillator signal OSC_OUT which has a predetermined period. In addition, the oscillator signal OSC_OUT may be transferred to the signal generator PLS GEN, and the signal generator PLS GEN may generate the count check signal CNT_CHK on the basis of the oscillator signal OSC_OUT.

Figure 12:
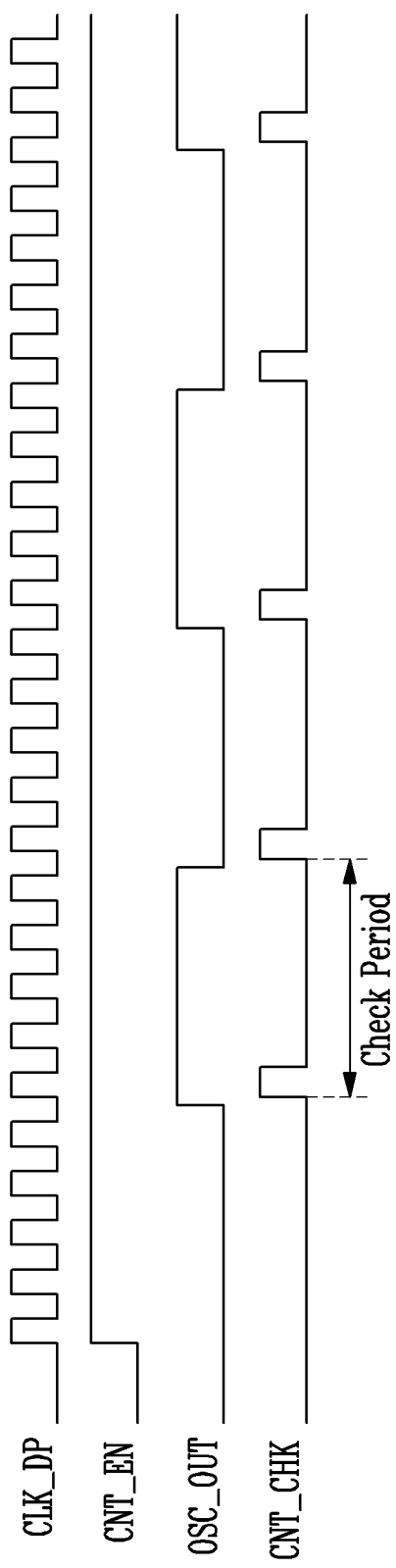
FIG. 12 is a timing diagram illustrating a counter controller according to an embodiment of the present disclosure.

FIG. 12 is a timing diagram illustrating the counter controller 323 according to one embodiment of the present disclosure.

FIG. 12 is a timing diagrams of the data processing clock signal CLK_DP, the count enable signal CNT_EN, the oscillator signal OSC_OUT and the count check signal CNT_CHK.

First, when the data processing clock signal CLK_DP is toggled, the count enable signal CNT_EN may be enabled. After the count enable signal CNT_EN is enabled, the oscillator signal OSC_OUT which has a predetermined period may be generated by the operation of the ring oscillator 324. The oscillator signal OSC_OUT may be transferred to the signal generator PLS GEN, which may detect respective edges (e.g., a rising edge and a falling edge) of the oscillator signal OSC_OUT and generate the count check signal CNT_CHK at each edge. In other words, whenever a digital value of the oscillator signal OSC_OUT changes from 0 to 1 or from 1 to 0, that is, at each period Check Period, the signal generator PLS GEN may generate the count check signal CNT_CHK. The count check signal CNT_CHK generated by the signal generator PLS GEN at each period Check Period may be transferred to the comparator 325. The comparator 325 may check the number of toggles of the data processing clock signal CLK_DP at each period Check Period.

Figure 13:
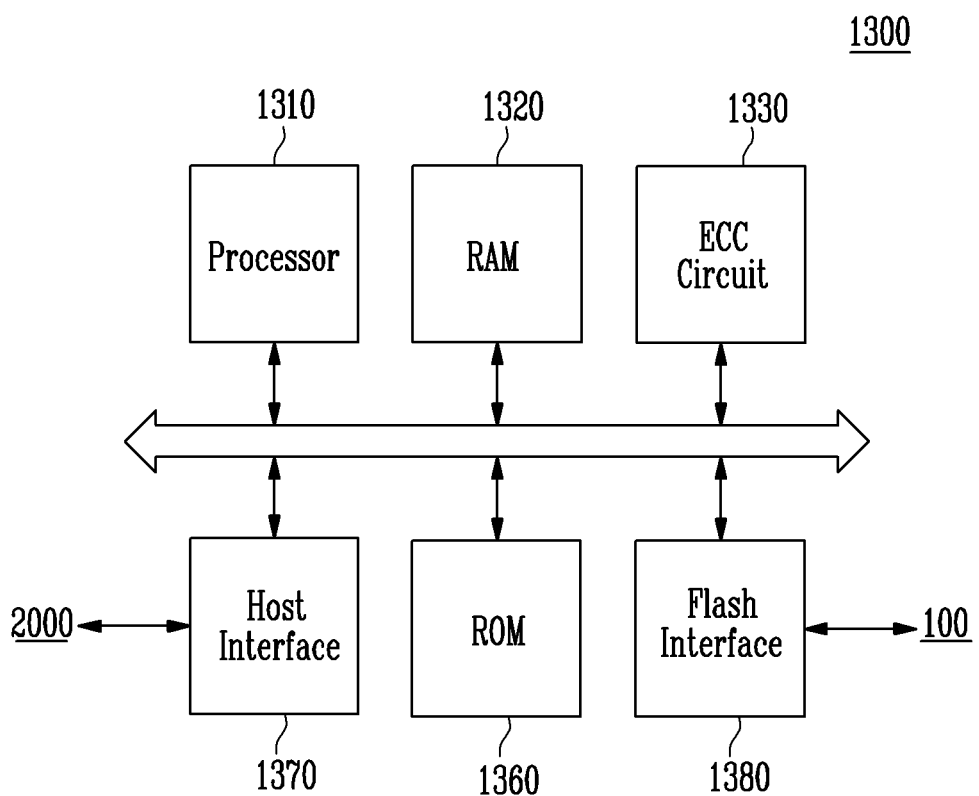
FIG. 13 is a block diagram illustrating a memory controller according to another embodiment of the present disclosure.

FIG. 13 is a block diagram illustrating a memory controller 1300 according to another embodiment of the present disclosure.

Referring to FIG. 13, the memory controller 1300 may include a processor 1310, a RAM 1320, an ECC circuit 1330, a ROM 1360, a host interface 1370, and a flash interface 1380.

The processor 1310 may communicate with the host 2000 using the host interface 1370 and perform a logical operation so as to control the operations of the memory controller 1300. For example, the processor 1310 may load program commands, data files, data structures, etc. based on a request from the host 2000 or another external device, and may perform various operations or generate commands or addresses. For example, the processor 1310 may generate various commands for a program operation, a read operation, an erase operation, a suspend operation and a parameter setting operation.

In addition, the processor 1310 may function as a flash translation layer FTL. The processor 1310 may translate a logical block address LBA provided by the host 2000 into a physical block address PBA through the flash translation layer FTL. The flash translation layer FTL may receive the logical block address LBA and translate the logical block address LBA into the physical block address PBA by using a mapping table. There may be various address mapping methods of the flash translation layer FTL, based on a mapping unit. Typical address mapping methods may include a page mapping method, a block mapping method and a hybrid mapping method.

According to one embodiment, the processor 1310 may generate a command without a request of the host 2000. For example, the processor 1310 may generate a command for background operations such as wear leveling operations of the memory device 100 and garbage collection operations of the memory device 100.

The RAM 1320 may serve as a buffer memory, a working memory, or a cache memory of the processor 1310. In addition, the RAM 1320 may store codes and commands executed by the processor 1310. The RAM 1320 may store data processed by the processor 1310. In addition, the RAM 1320 may be realized with static RAM (SRAM) or dynamic RAM (DRAM).

The ECC circuit 1330 may detect error(s) during a program operation or a read operation and correct the error(s). More specifically, the ECC circuit 1330 may perform an error correction operation according to an error correction code (ECC). In addition, the ECC circuit 1330 may perform ECC encoding based on data to be written to the memory device 100. The ECC-encoded data may be transferred to the memory device 100 through the flash interface 1380. In addition, the ECC circuit 1330 may perform ECC decoding on the data transferred from the memory device 100 through the flash interface 1380.

The ROM 1360 may serve as a storage for storing various kinds of information for operations of the memory controller 1300. More specifically, the ROM 1360 may include a map table that stores physical-logical address information and logical-physical address information. In addition, the ROM 1360 may be controlled by the processor 1310.

The host interface 1370 may include a protocol for exchanging data between the host 2000 and the memory controller 1300. More specifically, the host interface 1370 may communicate with the host 2000 through one or more various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer System interface (SCSI) protocol, an enhanced small disk interface (ESDI) protocol, an integrated drive electronics (IDE) protocol, a private protocol, etc.

The processor 1310 may control the flash interface 1380 to communicate with the memory device 100 using a communication protocol. More specifically, the flash interface 1380 may transmit/receive commands, addresses, and data to/from the memory device 100 through channels. For example, the flash interface 1380 may include a NAND interface.

Figure 14:
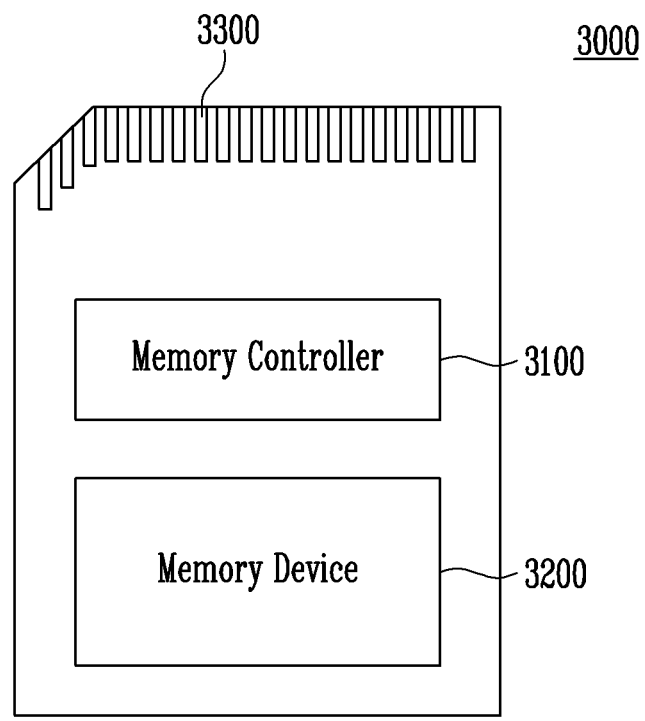
FIG. 14 is a block diagram illustrating a memory card system according to an embodiment of the present disclosure.

FIG. 14 is a block diagram illustrating a memory card system 3000 according to one embodiment of the present disclosure.

Referring to FIG. 14, the memory card system 3000 may include a memory controller 3100, a memory device 3200, and a connector 3300.

The memory controller 3100 may be coupled to the memory device 3200. The memory controller 3100 may access the memory device 3200. For example, the memory controller 3100 may control read, program, erase, and background operations of the memory device 3200. The memory controller 3100 may be configured to provide an interface between the memory device 3200 and the host. The memory controller 3100 may be configured to drive firmware for controlling the memory device 3200.

In an embodiment, the memory controller 3100 may include components, such as a Random Access Memory (RAM), a processing unit, a host interface, a flash interface, and an ECC circuit.

The memory controller 3100 may communicate with an external device through the connector 3300. The memory controller 3100 may communicate with an external device (e.g., host) based on a specific communication protocol. In an embodiment, the memory controller 3100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) protocols. In one embodiment, the connector 3300 may be defined by at least one of the above-described various communication protocols.

In one embodiment, the memory device 3200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin-Transfer Torque Magnetic RAM (STT-MRAM).

In one embodiment, the memory device 3200 and the memory controller 3100 may be integrated into a single semiconductor device to form a memory card. For example, the memory controller 3100 and the memory device 3200 may be integrated into a single semiconductor device and form a memory card, such as a personal computer memory card international association (PCMCIA), a compact flash (CF) card, a smart media card (SM or SMC), a memory stick, a multimedia card (MMC, RS-MMC, or MMCmicro), a SD card (SD, miniSD, microSD, or SDHC), a universal flash storage (UFS), and the like.

Figure 15:
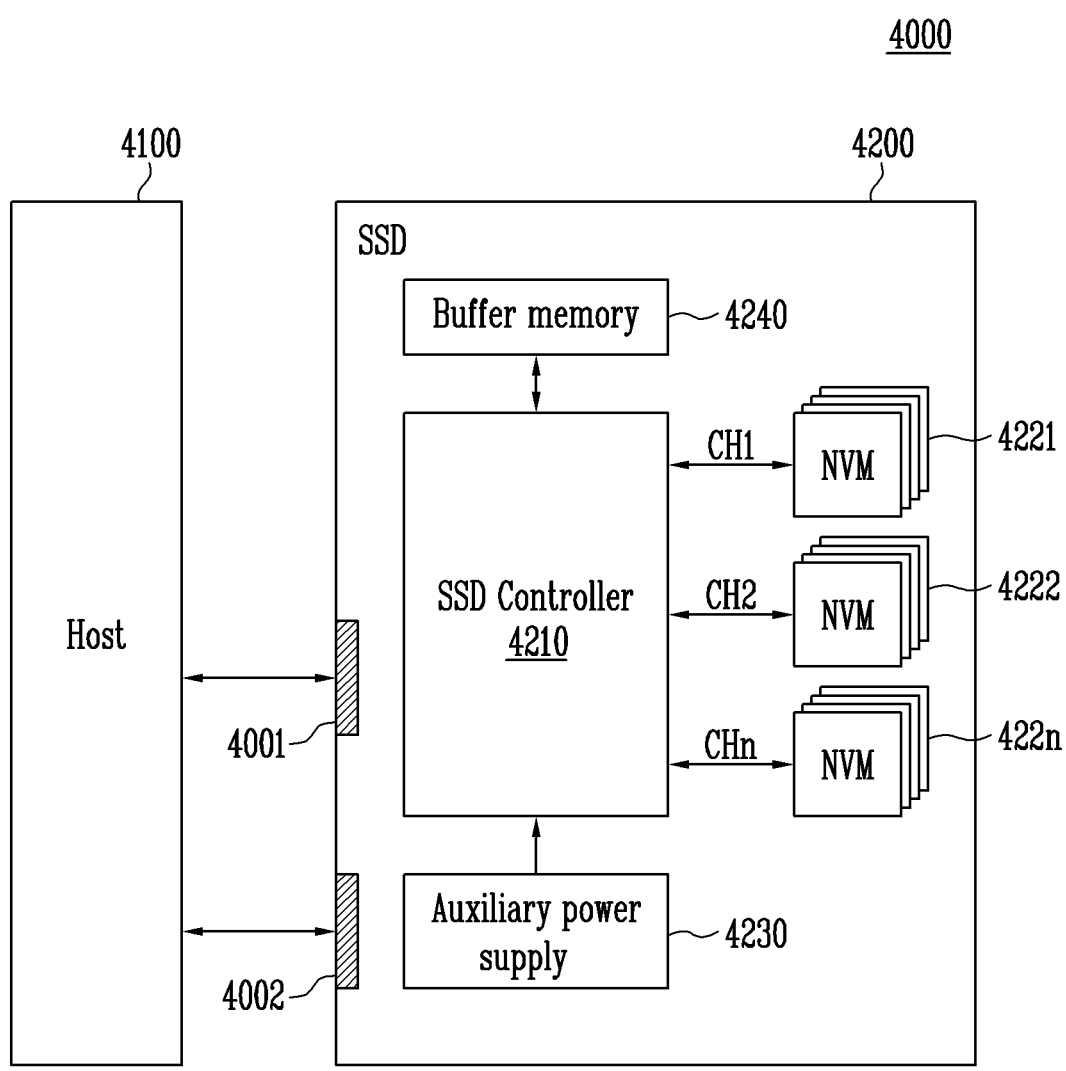
FIG. 15 is a block diagram illustrating a solid state drive (SSD) system according to an embodiment of the present disclosure.

FIG. 15 is a block diagram illustrating a solid state drive (SSD) system 4000 according to one embodiment of the present disclosure.

Referring to FIG. 15, the SSD system 4000 may include a host 4100 and an SSD 4200. The SSD 4200 may exchange signals SIG with the host 4100 through a signal connector 4001 and may receive power PWR through a power connector 4002. The SSD 4200 may include an SSD controller 4210, a plurality of flash memories 4221 to 422n, an auxiliary power supply 4230, and a buffer memory 4240.

In one embodiment, the SSD controller 4210 may perform the function of the memory controller 200 as described above with reference to FIG. 13. The SSD controller 4210 may control the plurality of flash memories 4221 to 422n in response to the signals SIG received from the host 4100. In one embodiment, the signals SIG may be based on the interfaces of the host 4100 and the SSD 4200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

In one embodiment, the auxiliary power supply 4230 may be coupled to the host 4100 through the power connector 4002. The auxiliary power supply 4230 may be supplied and charged with the power PWR from the host 4100. The auxiliary power supply 4230 may supply the power of the SSD 4200 when the power PWR is not smoothly supplied from the host 4100. In one embodiment, the auxiliary power supply 4230 may be positioned inside or outside the SSD 4200. For example, the auxiliary power supply 4230 may be in a main board and may supply auxiliary power to the SSD 4200.

The buffer memory 4240 may serve as a buffer memory of the SSD 4200. For example, the buffer memory 4240 may temporarily store data received from the host 4100 or data received from the plurality of flash memories 4221 to 422n, or may temporarily store metadata (e.g., mapping tables) of the flash memories 4221 to 422n. The buffer memory 4240 may include volatile memories such as DRAM, SDRAM, DDR SDRAM, LPDDR SDRAM, and GRAM, or nonvolatile memories such as FRAM, ReRAM, STT-MRAM, and PRAM.

Figure 16:
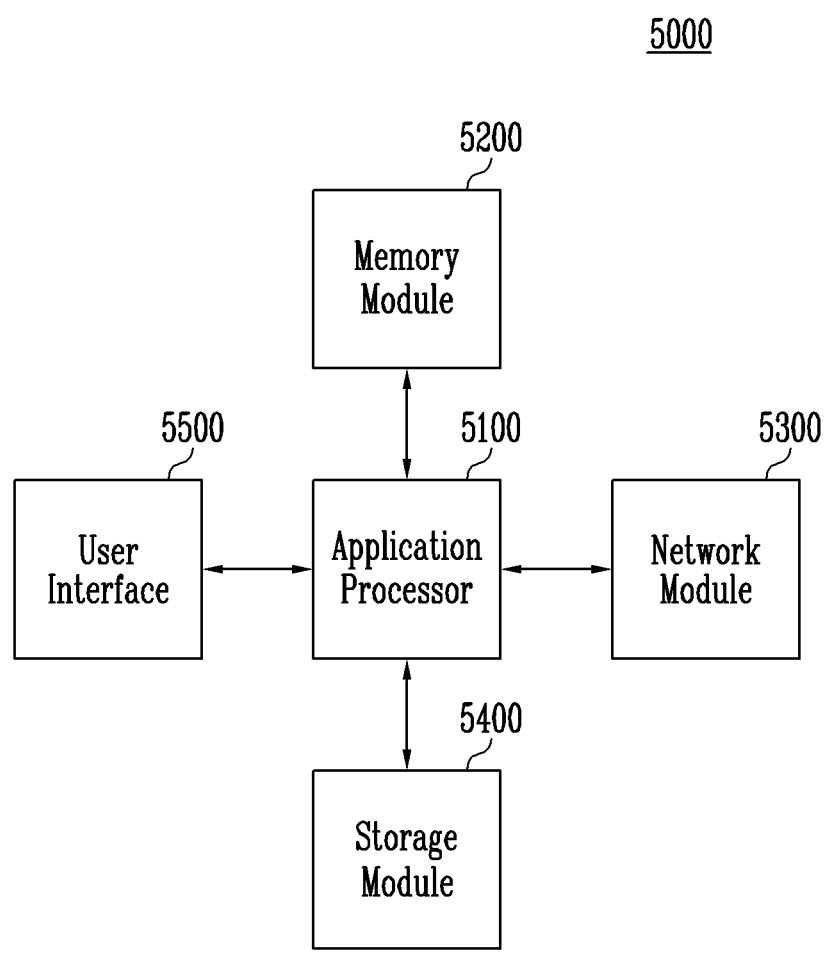
FIG. 16 is a block diagram illustrating a user system according to an embodiment of the present disclosure.

FIG. 16 is a block diagram illustrating a user system 5000 according to one embodiment of the present disclosure.

Referring to FIG. 16, the user system 5000 may include an application processor 5100, a memory module 5200, a network module 5300, a storage module 5400, and a user interface 5500.

The application processor 5100 may run components included in the user system 5000, an Operating System (OS), or a user program. In one embodiment, the application processor 5100 may include controllers, interfaces, graphic engines, etc. for controlling the components included in the user system 5000. The application processor 5100 may be provided as a system-on-chip (SoC).

The memory module 5200 may function as a main memory, a working memory, a buffer memory or a cache memory of the user system 5000. The memory module 5200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM or nonvolatile RAMs such as PRAM, ReRAM, MRAM, and FRAM. In one embodiment, the application processor 5100 and the memory module 5200 may be packaged based on package-on-package (POP) and may then be provided as a single semiconductor package.

The network module 5300 may communicate with external devices. For example, the network module 5300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. In one embodiment, the network module 5300 may be included in the application processor 5100.

The storage module 5400 may store data. For example, the storage module 5400 may store data received from the application processor 5100. Alternatively, the storage module 5400 may transmit the data stored in the storage module 5400 to the application processor 5100. In one embodiment, the storage module 5400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In one embodiment, the storage module 5400 may be provided as a removable storage medium (i.e., removable drive), such as a memory card or an external drive of the user system 5000.

For example, the storage module 5400 may include a plurality of non-volatile memory devices, and the plurality of non-volatile memory devices may operate in the same manner as the memory device 100 described above with reference to FIG. 1. The storage module 5400 may operate in the same manner as the storage device 1000 as described above with reference to FIG. 1.

The user interface 5500 may include interfaces which input data or commands to the application processor 5100 or output data to an external device. In one embodiment, the user interface 5500 may include user input interfaces such as one or more of a keyboard, a keypad, a button, a touch panel, a touch screen, a touch pad, a touch ball, a camera, a microphone, a gyroscope sensor, a vibration sensor, and a piezoelectric device. The user interface 5500 may further include user output interfaces such as for example one or more of a Liquid Crystal Display (LCD), an Organic Light Emitting Diode (OLED) display device, an Active Matrix OLED (AMOLED) display device, an LED, a speaker, and a monitor.

According to one embodiment of the present disclosure, a warm-up cycle operation for an improved data transmission/reception operation may be implemented.

In the above-discussed embodiments, all steps may be selectively performed or skipped. In addition, the steps in each embodiment may not always be performed in regular order. Furthermore, while the embodiments disclosed in the present specification and the drawings provide those with ordinary knowledge in this art a clear understanding of the present disclosure, the present invention is not limited to the bounds of the present disclosure. In other words, one of ordinary skill in the art to which the present disclosure belongs will understand that various modifications of the present invention are possible based on the technical scope of the present disclosure. It will be apparent to those skilled in the art that various modifications can be made to the above-described embodiments of the present disclosure without departing from the spirit or scope of the invention. Thus, the present disclosure covers all such modifications.

What is claimed is:

1. A memory device, comprising:
 a clock generator generating a data processing clock signal based on an external clock signal; and
 an input/output circuit performing a data transmission/reception operation of transmitting/receiving data to/from an external device based on the data processing clock signal,
 wherein the clock generator comprises a warm-up operation controller generating a warm-up enable signal for recognizing a portion of a period of the external clock signal as a dummy signal, and resetting the warm-up enable signal when a pause period where a toggle of the external clock signal is temporarily stopped is detected.

2. The memory device of claim 1, wherein the clock generator further comprises a pause detector detecting the pause period based on the data processing clock signal.

3. The memory device of claim 2, wherein the pause detector comprises:
 a counter counting a number of toggles of the data processing clock signal according to a counter enable signal; and
 a counter controller generating the counter enable signal when the data processing clock signal is detected.

4. The memory device of claim 3,
 wherein the counter controller further generates a count check signal having a predetermined period, and
 wherein the pause detector detects whether the pause period exists according to the predetermined period.

5. The memory device of claim 3, wherein the counter controller further disables the counter enable signal when the pause period is detected.

6. The memory device of claim 3, wherein the pause detector further includes a comparator comparing the number of toggles of the data processing clock signal with a predetermined number to detect the pause period.

7. The memory device of claim 6, wherein the comparator further generates, when the pause period is detected, a warm-up reset signal for the warm-up operation controller to reset the warm-up enable signal in response to the warm-up reset signal.

8. The memory device of claim 1, wherein the clock generator recognizes a portion of the period of the external clock signal, which is resumed as the dummy signal when an input of the external clock signal is resumed.

9. The memory device of claim 8, wherein the warm-up operation controller generates the warm-up enable signal to recognize the portion of the period of the external clock signal, which is resumed, as the dummy signal.

10. The memory device of claim 1, wherein the portion of the period corresponds to a predetermined time interval after the external clock signal is input to the clock generator.

11. A method of operating a memory device transmitting/receiving data to/from an external device, the method comprising:
 receiving an external clock signal;
 generating a warm-up enable signal to recognize a portion of a period of the external clock signal as a dummy signal;
 generating a data processing clock signal based on the warm-up enable signal and the external clock signal;
 detecting a pause period where a toggle of the external clock signal is temporarily stopped; and
 resetting the warm-up enable signal when the pause period is detected.

12. The method of claim 11, wherein the detecting of the pause period comprises detecting the pause period based on the data processing clock signal.

13. The method of claim 12, wherein the detecting of the pause period comprises:
 generating a count enable signal when the data processing clock signal is detected; and
 counting a number of toggles of the data processing clock signal according to the count enable signal.

14. The method of claim 13, wherein the detecting of the pause period further comprises detecting whether the pause period exists according to a predetermined period.

15. The method of claim 13, wherein the detecting of the pause period further comprises disabling the count enable signal when the pause period is detected.

16. The method of claim 11, wherein the pause period is detected by comparing a number of toggles of the data processing clock signal with a predetermined number.

17. The method of claim 11, wherein the resetting of the warm-up enable signal comprises generating, when the pause period is detected, a warm-up reset signal to reset the warm-up enable signal.

18. The method of claim 11, further comprising, when an input of the external clock signal, which is resumed after the pause period, generating the warm-up enable signal to recognize the portion of the period of the external clock signal as the dummy signal.

19. The method of claim 11, wherein the portion of the period corresponds to a predetermined time interval after the external clock signal is input to the memory device.

20. A semiconductor apparatus comprising:
 an operation control circuit configured to perform an operation according to a first clock signal; and
 a clock generating circuit configured to:
 enable, in response to activation of a second clock signal, a warm-up enable signal at a predetermined amount of time after the activation to activate the first clock signal, the second clock signal having a leading deactivated time section and the first clock signal having a lagging deactivated time section; and disable the warm-up enable signal when detecting the lagging deactivated time section.

\* \* \* \* \*